United States Patent
Roth et al.

[11] Patent Number: 5,874,857
[45] Date of Patent: Feb. 23, 1999

[54] AMPLIFIER STAGE WITH DB-LINEAR OUTPUT VOLTAGE

[75] Inventors: Sabine Roth, Mönchweiler; Martin Rieger, Rottwell, both of Germany

[73] Assignee: Deutsche Thomson Brandt GmbH, Villingen Schwenningen, Germany

[21] Appl. No.: 600,974

[22] PCT Filed: Aug. 25, 1994

[86] PCT No.: PCT/EP94/02810

§ 371 Date: Jul. 19, 1996

§ 102(e) Date: Jul. 19, 1996

[87] PCT Pub. No.: WO95/07574

PCT Pub. Date: Mar. 16, 1995

[30] Foreign Application Priority Data

Sep. 4, 1993 [DE] Germany ............ 43 29 896.6

[51] Int. Cl.[6] ...................................... H03F 3/45

[52] U.S. Cl. ............................. 330/254; 327/359
[58] Field of Search ...................... 330/254, 256, 330/279; 327/359, 563

[56] References Cited

U.S. PATENT DOCUMENTS

| | | | |
|---|---|---|---|
| 4,004,141 | 1/1977 | Curtis | 235/194 |
| 4,429,416 | 1/1984 | Page | 455/211 |
| 5,057,717 | 10/1991 | Kimura | 307/492 |
| 5,589,791 | 12/1996 | Gilbert | 327/359 |

*Primary Examiner*—Steven Mottola
*Attorney, Agent, or Firm*—Joseph S. Tripoli; Frederick A. Wein; Peter M. Emanuel

[57] ABSTRACT

A multiplying amplifier which is controlled in a dB linear manner. Transistors, having a numerical distribution coeffient and having the output voltage to be dB-linearly dependent responsive to a control voltage, are connected to the inputs of a mulipler.

8 Claims, 6 Drawing Sheets

AMPLIFIER STAGE WITH DB-LINEAR OUTPUT VOLTAGE

BACKGROUND

It is known to use a multiplier for gain control. The control signal is applied to one input of the multiplier and the input signal is applied to the second input of the multiplier. The output signal is present at the output.

In the case of known gain control, the output signal is linear with respect to the control signal. Given an input signal of 1 volt and a control signal between 0 and 10 volts, it is possible to realize linear gain properties having factors between 0 and 100. That is to say that a gain factor of 100 is produced for a control signal of 10 volts, and for a control signal of 5 volts the gain factor is 50. If the gain factors are expressed in dB, the gain factor of 100 corresponds to a value of 40 dB and the gain factor of 50 corresponds to the value 34 dB. A linear amplifier is therefore unsuitable for dB linearity, since the changes in the output signal have a great effect in the lower control ranges whereas, in the upper control ranges, the changes in the controlled variable do not have much of an effect on the output signal.

The gain factors lie between the values 1 and 1000 in the IF range. These gain factors must be distributed uniformly over the control voltage, and dB linearity between the output voltage and the control signal is therefore to be aimed at.

It is furthermore known from U.S. Pat. No. 5,057,717 and U.S. Pat. No. 4,004,141 to change an output voltage as a logarithmic function of the input voltage.

SUMMARY OF THE INVENTION

The invention is based on the object of designing a controlled multiplying amplifier to be dB linear.

According to the invention, the inputs of the multiplying amplifier have transistors connected upstream of them for drive purposes. These transistors are to be equated with transistor areas on a chip. If the number of upstream transistors or transistor areas upstream of each input of the multiplier is selected to be identical, the multiplier operates linearly. If the number of transistors or transistor areas upstream of the inputs is selected to be different, then dB linearization is possible given a suitable distribution ratio of the transistors or transistor area ratios.

By controlling the current which is fed via the transistors to the inputs of the multiplier, the dB linearity can be set precisely. The appropriate distribution ratio of the transistors and thus a suitable current control can be determined by means of the series expansion.

A control unit is used to convert the control voltage into a current, on the one hand, and to compensate for temperature effects, on the other hand. The control unit has a constant component which ensures a minimum gain of 1.

The best dB linearization possible is produced with the transistor distribution ratio of 1:5. What is advantageous with this circuit is that dB linearization is made possible at low cost.

BRIEF DESCRIPTION OF THE DRAWINGS

The invention is explained below with reference to the drawings, in which.

DETAILED DESCRIPTION OF THE PREFERRED EMBODIMENTS

Figure 1:
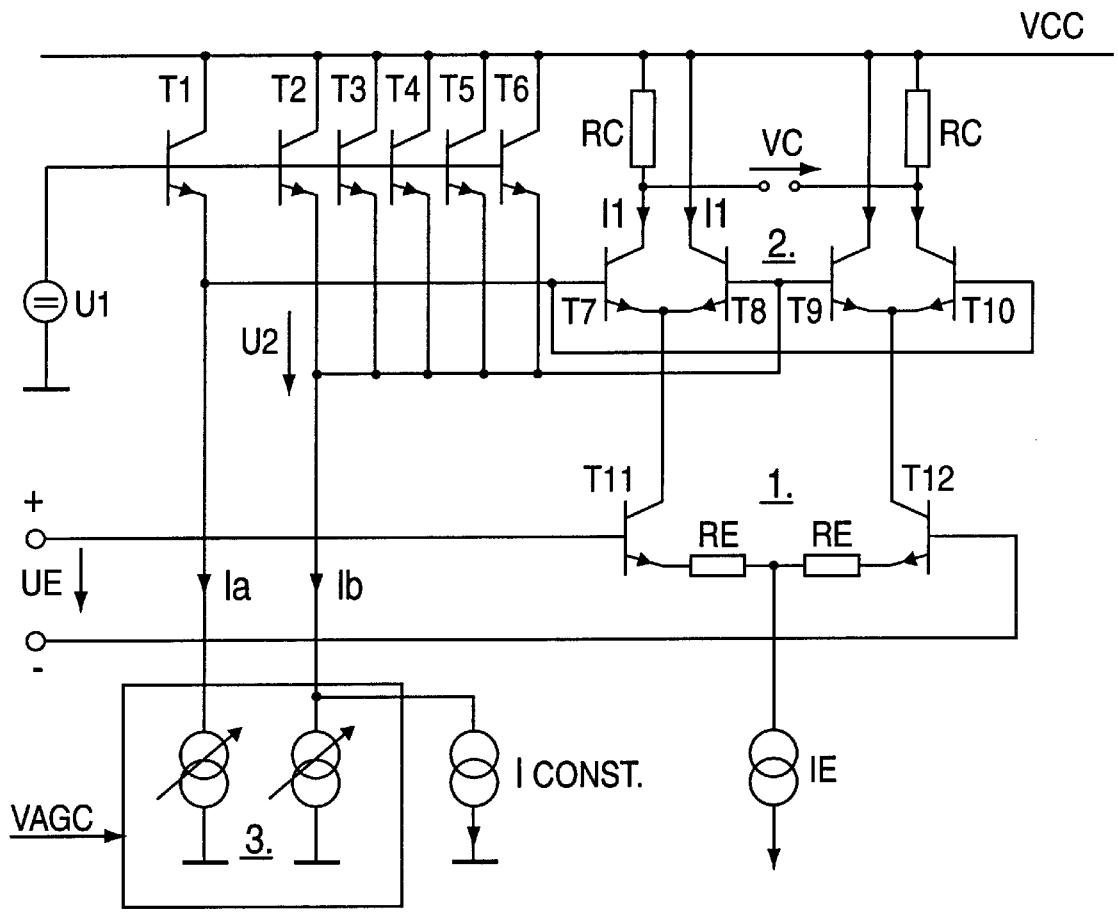
FIG. 1 shows a circuit constructed according to the invention.

FIG. 1 shows a dB-linearized multiplier. The IF voltage UE is converted into the current IE by means of a voltage/current converter 1, which is formed by the transistors T11, T12 and the resistors RE. The current IE is drawn off by the upper multiplier 2. A DC signal U2 is present at the inputs of the multiplier 2. The output voltage VC is present at the output of the multiplier 2. The DC U1 is present at the base of the transistors T1, T2, T3, T4, T5, T6. The DC signal U2 changes its value as a function of the currents Ia, Ib. The control unit 3 converts the control voltage VAGC into the currents Ia and Ib. The current Ia is drawn off by the transistor T1 depending on the control unit 3. The current Ib is drawn off by the transistors T2, T3, T4, T5, T6 depending on the control unit 3. The currents Ia, Ib are controlled by means of the control unit 3 as a function of the control voltage VAGC. The currents Ia and Ib are mutually complementary, that is to say when one current increases, the other current decreases. The control unit 3 has a constant component Iconst, by means of which a minimum gain of 1 is produced. The DC signal U2 depends on the currents Ia, Ib and drives the multiplier in such a way that the current IE is switched and results in a current I1 or a current I2. The ratio of Ia to Ib is equal to the ratio of I1 to I2. The current I1 effects a voltage drop across the resistor RC and supplies an amplified signal via the voltage VC. The current I2 does not effect a voltage drop across the resistor RC and reduces the amplified signal via the voltage VC. In this way, the signal distribution is controlled in such a way that dB linearity of the output voltage VC as a function of the IF voltage UE and the control voltage VAGC is made possible.

The effect of the distribution ratio NT of transistors of the same type in relation to the inputs of the multiplier 2 is described below. The voltage drop between the base and the emitter controls the current distribution for the transistors T1 to T6. In the case of an equal distribution ratio, all of the currents are distributed equally. That is to say that the ratio of Ia to Ib is equal to the ratio I1 to I2. This is the usual direct current distribution which controls the high-frequency distribution of the current, with the distribution ratio 1:1 in this case. Given a differently selected distribution ratio such as, for example, 1:5, a smaller partial current of the current Ib flows through each individual transistor of the parallel arrangement of five transistors, and the voltage drop will decrease in accordance with a special rule.

This rule is to be drawn up in accordance with the diode characteristic $$I_c = I_z * \exp\left(\frac{U_{BE}}{U_{Tems}}\right),$$

yielding the formula $$U_{Be} = U_{Temp} * \ln\left(\frac{I_C}{I_s}\right).$$

In this case, Is denotes the reverse saturation current of the diode. It is evident that the base/emitter voltage changes as a function of the natural logarithmic function of the current ratio. The voltage saturation current consequently depends on the number of transistors and is distributed uniformly between the transistors T2 to T6. The reverse saturation current Is is produced from the transistors T2 to T6, and the base/emitter ratio thus decreases by a factor of five. The voltage $$U_1 - U_2 = \left[ \ln\left(\frac{I_o}{5*I_c}\right) * U_{Temp} \right].$$

is produced for the selected ratio 1:5. Consequently, the selected ratio is adopted into the formula with the logarithm. The ratio 1:5, that is to say T1 : T2, T3, T4, T5, T6, ensures dB linearity at the output.

Figure 2:
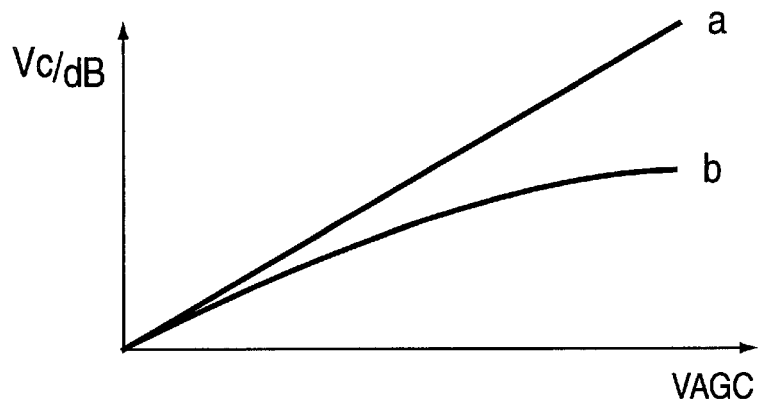
FIG. 2 shows the characteristic obtained with the circuit according to FIG. 1.

FIG. 2 shows the desired curve profile. The output voltage VC [dB] is illustrated as a function of the control voltage VAGC [V]. The curve profile a shows the dB-linear profile with respect to the control voltage VAGC given a selected distribution ratio NT=1:5. The curve profile b shows an approximately linear curve profile given a selected distribution ratio NT=1:3. It is clearly evident that dB linearity is achieved with the selected distribution ratio NT=1:5.

Figure 3:
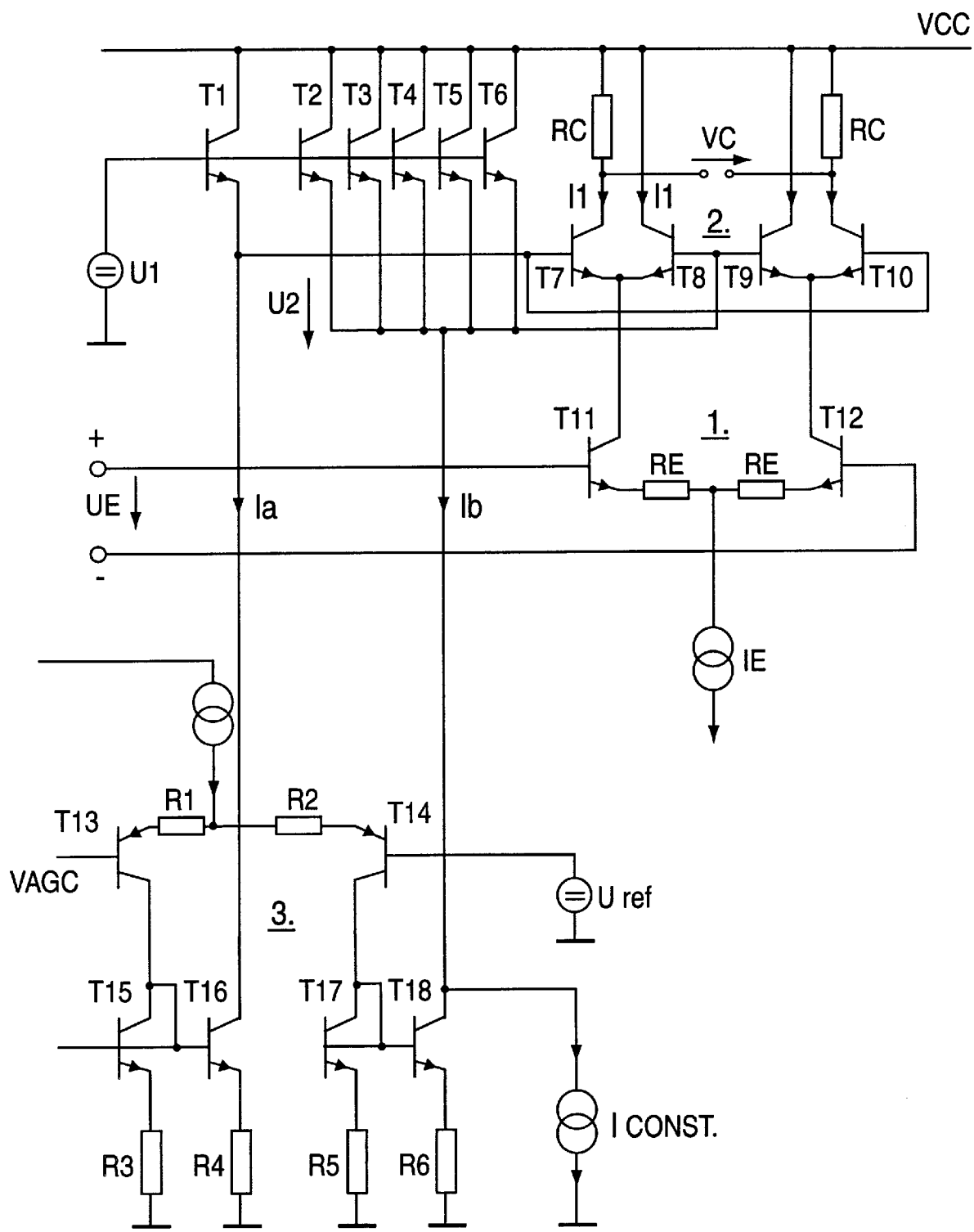
FIG. 3 shows a development of the circuit constructed according to the invention.

FIG. 3 shows a modified circuit, the alteration in comparison with FIG. 1 residing in the way in which the control unit 3 is embodied. The control unit 3 comprises the transistors T13, T14, T15, T16, T17, T18, the resistors R1, R2, R3, R4, R5, R6, the reference voltage source Uref and the constant-current source Iconst. The control unit 3 converts the control voltage VAGC into the currents Ia and Ib. The different distribution ratio results in a temperature response due to the different currents, which temperature response needs to be compensated for. In this case of this circuit arrangement, the currents Ia, Ib are readjusted such that the gain remains constant as a function of the temperature.

Figure 4:
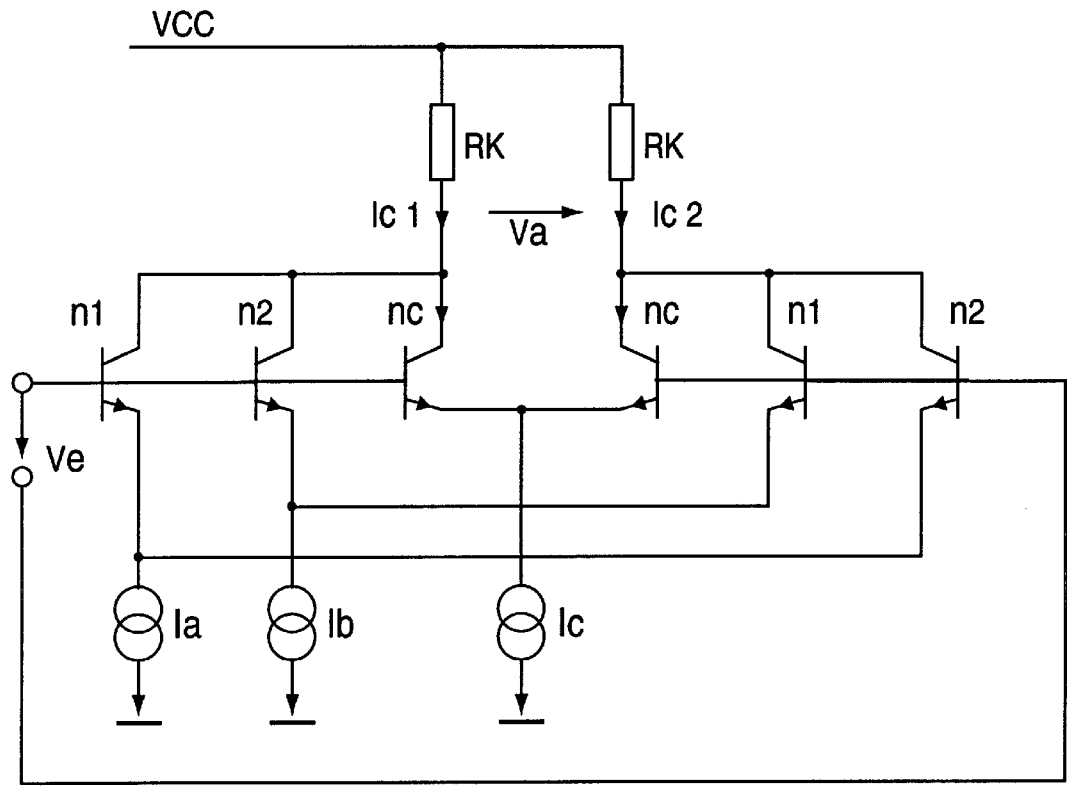
FIGS. 4,5,6,7,8,9,10 and 11 show developments of the circuit constructed according to the invention.

FIG. 4 shows a controllable amplifier having balanced emitter areas. The amplifier comprises three coupled differential amplifiers n1, n2, nc. The emitter areas of the transistors are different. The differential amplifier nc, in the centre, has emitter areas nc*Ae, where nc is an integer and Ae is the emitter unit of area (for example 5 μm*5 μm). The two outer differential amplifiers n1, n2 have emitter areas n1*Ae, n2*Ae and n2*Ae, n1*Ae, respectively. The control currents of the differential amplifiers are Ia, Ib and Ic. The collector current Ic1 emerges as $$i_{c1} = i_c * \frac{e^x}{1 + e^x} + i_a * \frac{\frac{n_1}{n_2} * e^x}{1 + \frac{n_1}{n_2} * e^x} +$$

$$i_b * \frac{\frac{n_2}{n_1} * e^x}{1 + \frac{n_2}{n_1} * e^x} \text{ where } x = \frac{V_c}{2V_T}$$

The voltage gain Av=va/ve emerges as $$Av = \frac{di_{c1}}{dx} * R_k.$$

The derivative $$\frac{dAv}{dx}$$

is a measure of the linearity of the gain. The gain Av accordingly depends on the modulation. If Ia=Ib, then $$\frac{dAv}{dx} = 2R_k \left[ i_c * \frac{e^X}{(1 + e^X)^2} + io \frac{2e^X + 4e^{2X} + 2e^{3X}}{1 + 4e^X + 6e^{2X} + 4e^{3X} + e^{4X}} \right]$$

where ia=ib=io.

The aim of the linear amplifier design is to achieve the largest possible modulation x with the voltage gain Av=constant. Using mathematical optimization methods, Ia, Ib, Ic, n1, n2 and nc can now be determined such that this is achieved.

Figure 5:
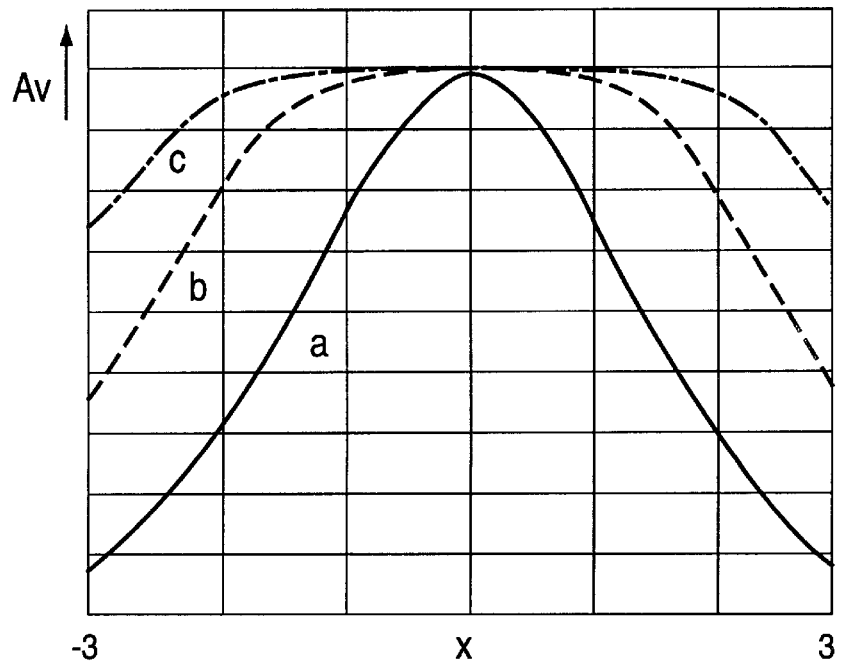

FIG. 5, curve a shows the profile of the voltage gain Av (x) for an amplifier which comprises only the middle differential amplifier nc. Curve b shows an amplifier which comprises only the two outer differential amplifiers n1. Curve c shows an amplifier which comprises all 3 differential amplifiers n1, n2, nc. The solution according to curve 2c shows a clearly improved linearity in the entire modulation range. The modulation limit for a permissible improvement of 1% is listed in Table 1 for the different versions, curve a, b and c.

TABLE 1

| Circuit/curve | | Modulation limit for a distortion actor k ≦ 1% |
|---|---|---|
| nc | / a | x ≦ 0.2 |
|  | / b | x ≦ 1.0 |
| n1, n2, nc | / c | x ≦ 1.8 |
| ideal |  | x → ∞ |

The new solution, curve c, shows an approximately doubled modulation range in comparison with the known solutions, curves a and b.

Figure 6:
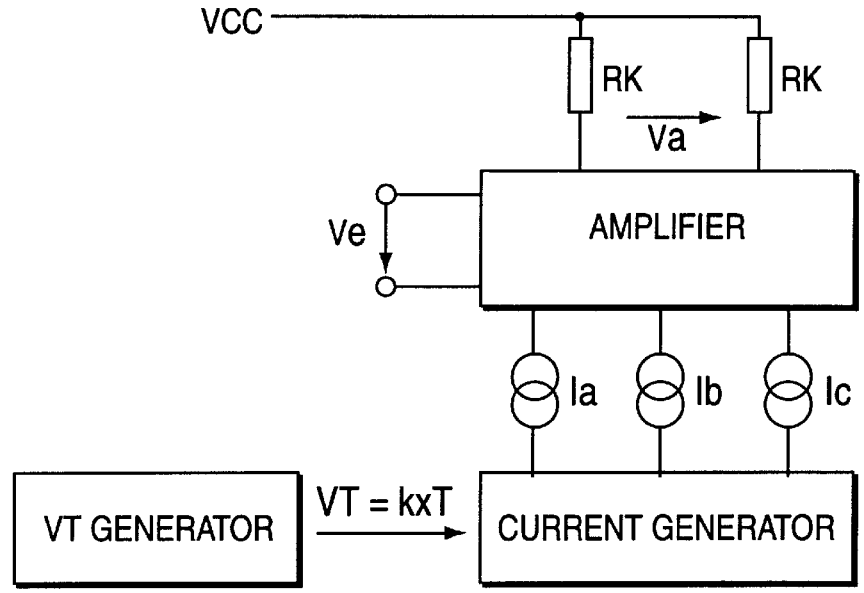

FIG. 6 shows a circuit having a temperature-dependent gain when the control currents increase proportionally to the temperature with the aid of a VT generator.

Figure 7:
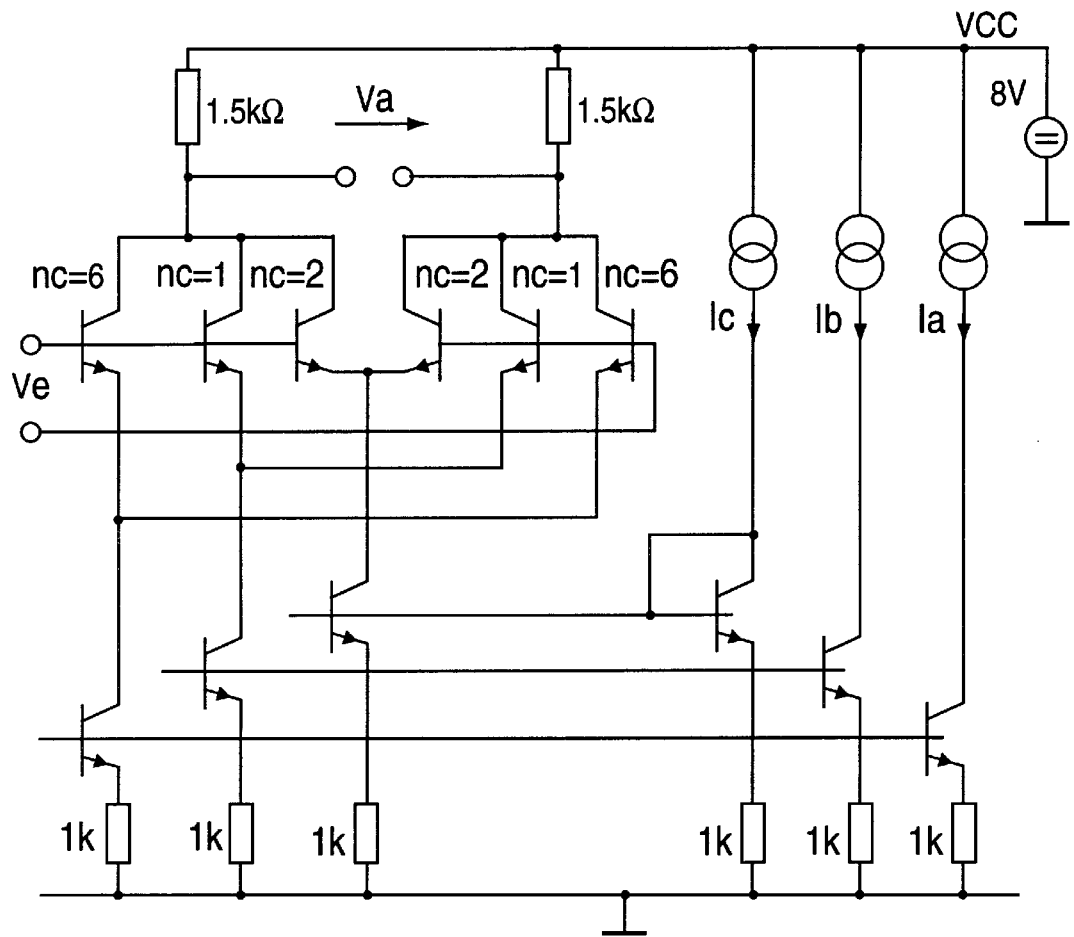

FIG. 7 shows a further exemplary embodiment. The amplifier comprises four amplifiers which are connected in a chain and are monolithically integrated. The maximum permissible input voltage Vin for a distortion factor k≦1% is 60 mVpp. The gain can be varied from 0 dB to 60 dB. The noise voltage level with reference to the amplifier is 5 nV/v. The bandwidth of the amplifier is greater than 120 MHz.

Figure 8:
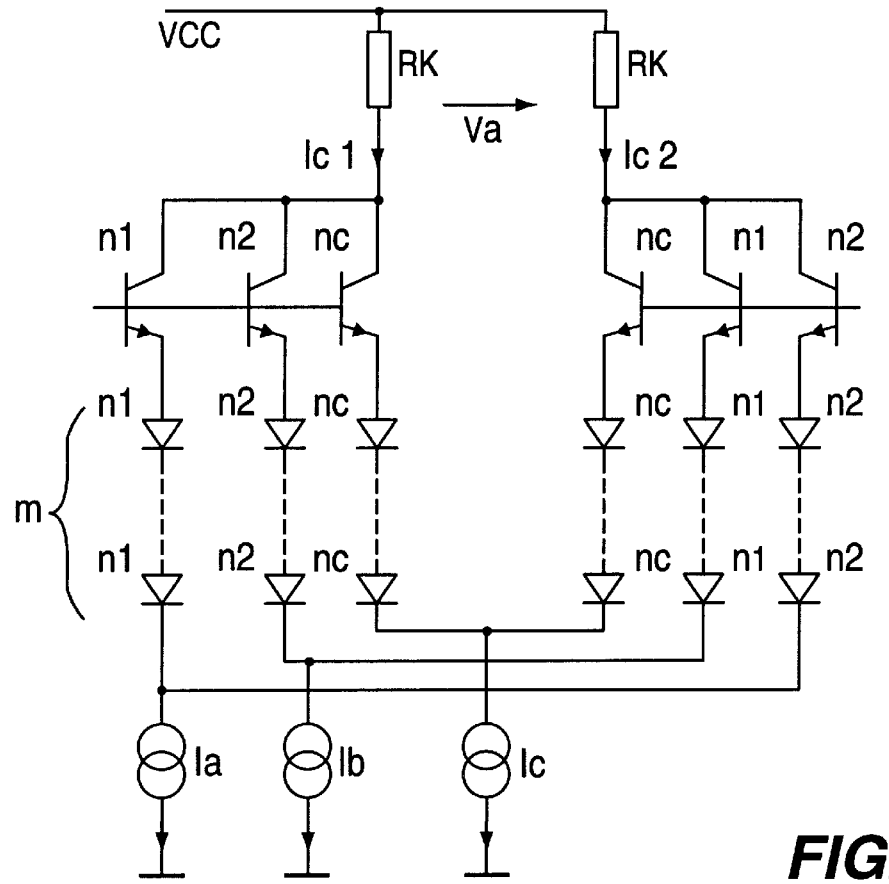

FIG. 8 shows a multiplication of the modulation range. The modulation range is increased m-fold by inserting m diodes into the emitter line of the differential amplifiers.

Figure 9:
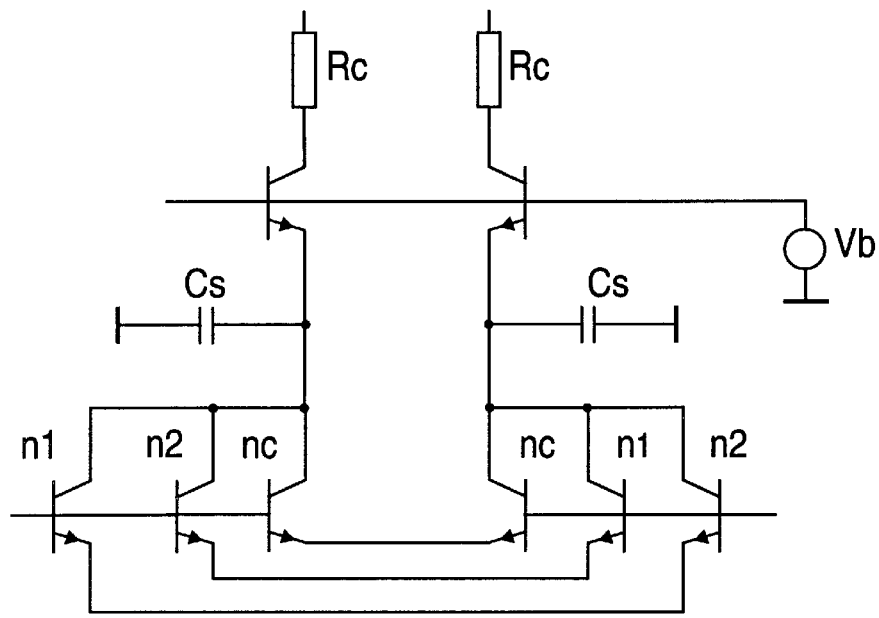

FIG. 9 shows a circuit for increasing the bandwidth. By means of a cascode circuit, the parasitic collector/substrate capacitance Cs can be rendered ineffective and hence the bandwidth can be increased.

Figure 10:
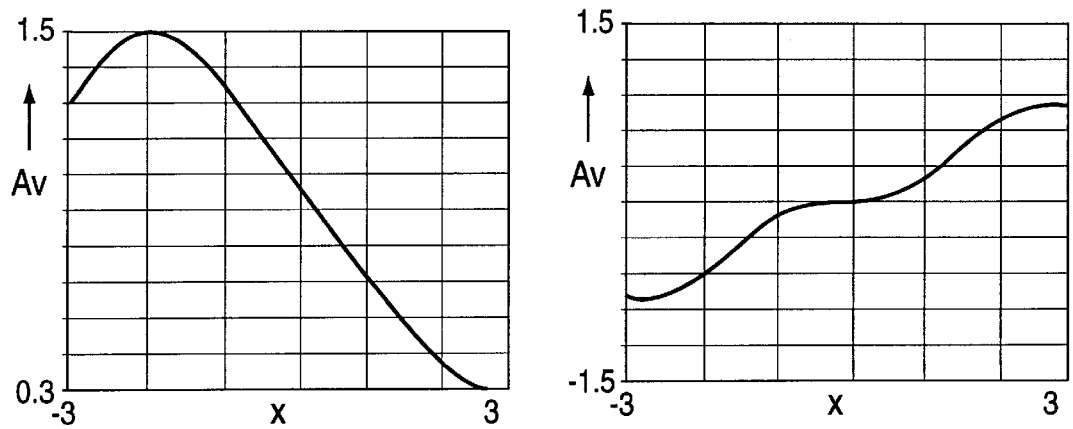

FIG. 10 shows a gain that is dependent on the input voltage. Gain curves of virtually any desired shape can be achieved by suitable selection of the differential amplifiers n1, n2, nc, ia, ib and ic. A further variant is produced by transposing the collector lines.

Figure 11:
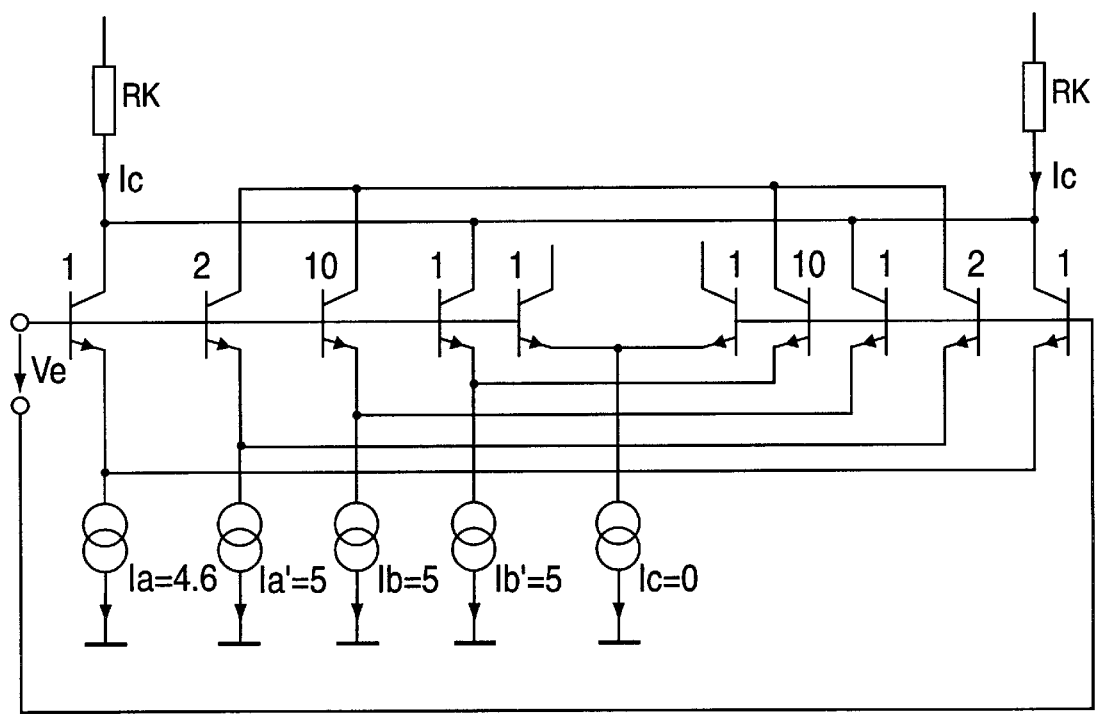

FIG. 11 shows a further differential amplifier 10. The modulation range in which the amplifier is linear can be extended by adding a further differential amplifier 10.

We claim:

1. Amplifier stage having a gain which changes linearly with the logarithm of a control voltage, with result that a change in the control voltage by a specific ratio corresponds to a change in gain by the same ratio in dB, comprising:

a multiplier which is controlled by the control voltage, and transistors connected between the control voltage and inputs of the multiplier, the transistors, by virtue of a numerical distribution ratio between two inputs, effect a dB-linear dependence of the output voltage relative to the control voltage.

2. Amplifier stage according to claim 1, wherein a control unit is provided which converts the control voltage into a current.

3. Amplifier stage according to claim 2, wherein the control unit adjusts the currents so that that the gain remains constant with temperature.

4. Amplifier according to claim 1, wherein the distribution ratio of the transistors upstream of the inputs of the multiplier has a value of about 1:5.

5. Amplifier stage according to claim 1, wherein the transistors are formed by corresponding transistor areas on a chip.

6. Amplifier stage according to claim 1, wherein, given a constant voltage gain, an increase in modulation range is achieved by coupling differential amplifiers.

7. Amplifier stage according to claim 6, wherein the modulation range is increased m-fold by inserting m diodes into an emitter line of the differential amplifiers.

8. Amplifier stage according to claim 1, wherein bandwidth is increased by means of a cascode circuit.

* * * * *